United States Patent [19]

Sagawa et al.

[11] Patent Number: 5,042,046
[45] Date of Patent: Aug. 20, 1991

[54] SEMICONDUCTOR LASER DEVICE

[75] Inventors: Misuzu Sagawa, Dublin, Ireland; Takashi Kajimura, Tokyo, Japan

[73] Assignee: Hitachi, Ltd., Tokyo, Japan

[21] Appl. No.: 489,282

[22] Filed: Mar. 6, 1990

[30] Foreign Application Priority Data

Mar. 6, 1989 [JP] Japan .................................. 1-51933
Mar. 10, 1989 [JP] Japan .................................. 1-056438
May 8, 1989 [JP] Japan .................................. 1-113709

[51] Int. Cl.⁵ .............................................. H01S 3/19
[52] U.S. Cl. ........................................ 372/50; 372/45; 372/46
[58] Field of Search ............................... 372/50, 45, 46

[56] References Cited

U.S. PATENT DOCUMENTS

| 4,712,220 | 12/1987 | Luft | 372/50 |
| 4,797,891 | 1/1989 | Uomi et al. | 372/50 |
| 4,811,354 | 3/1989 | Uomi et al. | 372/46 |
| 4,815,088 | 3/1989 | Matsumoto et al. | 372/50 |

FOREIGN PATENT DOCUMENTS

| 0010949 | 5/1980 | European Pat. Off. |
| 0174839 | 3/1986 | European Pat. Off. |
| 0227426 | 7/1987 | European Pat. Off. |
| 0214579 | 10/1985 | Japan |
| 0147791 | 7/1987 | Japan |

OTHER PUBLICATIONS

Scifres et al., "Phase-Locked (GaAl)As Laser Diode Emitting 2,6 W CW From A Single Mirror", Electronics Letts., vol. 19, Mar. 3, 1983.

Primary Examiner—Georgia Epps
Attorney, Agent, or Firm—Antonelli, Terry, Stout & Kraus

[57] ABSTRACT

A semiconductor laser device including a plurality of oscillation stripes so that phase locked oscillation can be generated at adjacent oscillation stripes is disclosed, in which device dummy regions for transmitting a current uncontributive to laser oscillation are arranged on both sides of an oscillation stripe region containing the oscillation stripes.

31 Claims, 15 Drawing Sheets

LASER BEAM

LASER BEAM

LASER BEAM

LASER BEAM

LASER BEAM

LASER BEAM

LASER BEAM

LASER BEAM

LASER BEAM

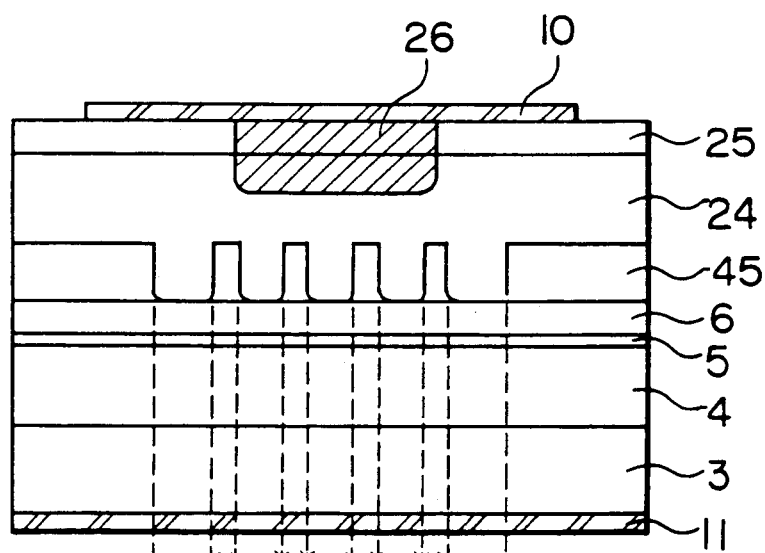
FIG. 18A
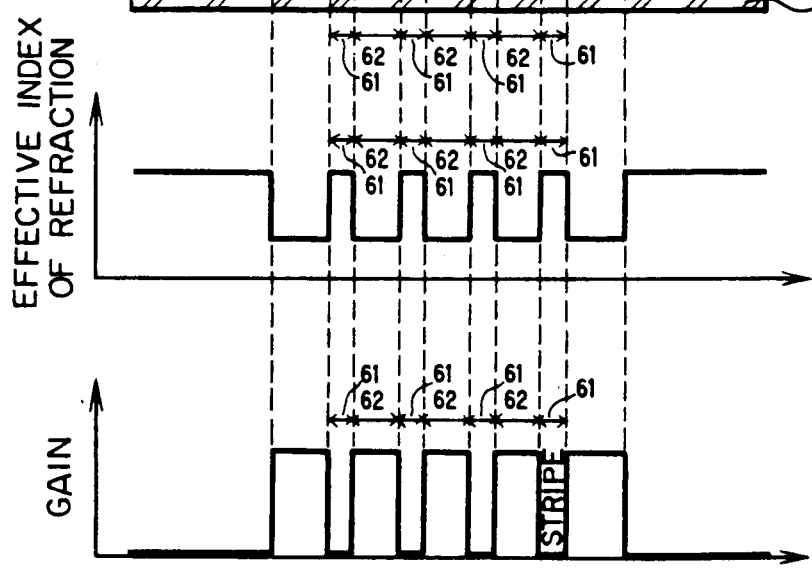
FIG. 18B
FIG. 18C

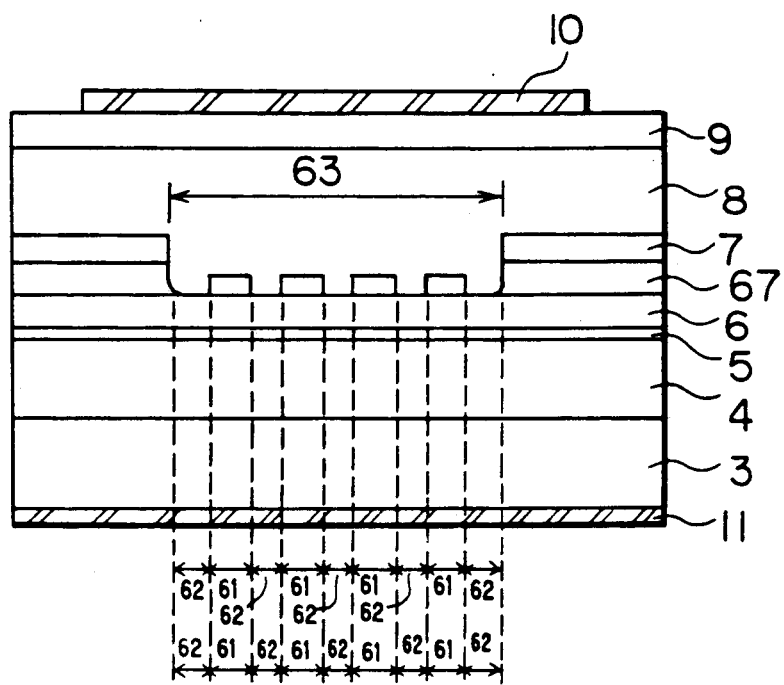
FIG. 19A
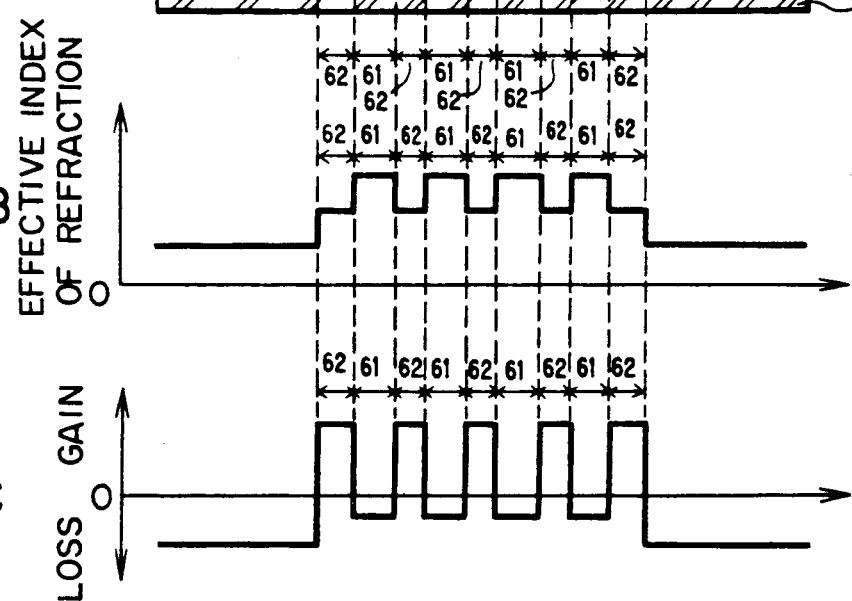
FIG. 19B
FIG. 19C

SEMICONDUCTOR LASER DEVICE

BACKGROUND OF THE INVENTION

The present invention relates to the structure of a semiconductor laser, and more particularly to a high-power semiconductor laser device necessary to apparatuses for consumer use.

The semiconductor laser device of this kind is used as a light source for a second harmonic generation, and is required to generate oscillation having a single transverse mode and to emit a high-power laser beam capable of forming a single lobed far field pattern. The output power of the laser device is determined by the optical power density at the facet thereof. That is, in order to increase the output power, it is required to enlarge the size of the light spot at the facet. As described in an article by D. R. Scifres et al. (Electronics Letts, Vol. 19, No. 5, 1983, pages 169 to 171), the output power can be increased by using a plurality of oscillation stripes (hereinafter simply referred to as "stripes") parallel to the direction of cavity length. In a case where the semiconductor laser is operated under pulsed current and thus it is unnecessary to take the generation of heat into consideration, all the stripes are equal in phase of oscillation to each other. FIG. 1 shows a laser beam in a case where the semiconductor laser is operated in a pulsive manner.

While, in a case where the semiconductor laser performs a CW (continuous wave) operation and thus it is necessary to take the generation of heat into consideration, phase-locked oscillation takes place only at central stripes and does not take place at outer stripes, as shown in FIG. 2. Thus, the coherency of an emitted laser beam is lowered. This phenomenon will be explained below, with reference to FIG. 3A. Now, let us consider a case where the semiconductor laser performs the CW operation. As shown in FIG. 3A, the temperature of a central portion of a stripe region is greatly increased, but the temperature of a peripheral portion of the stripe region is lower than the temperature of the central portion, because heat conducts from the peripheral portion to the outside of the stripe region. That is, non-uniform temperature distribution is generated in the stripe region. As a result, an optical property is not uniform in the stripe region. Thus, it is impossible to generate phase-locked oscillation all over the stripe region.

SUMMARY OF THE INVENTION

It is an object of the present invention to provide a semiconductor laser device of the phased array type, in which device phase-locked oscillation can take place all over a stripe region, independently of which of a CW operation and a pulsed operation is performed.

In order to attain the above object, in a semiconductor laser device according to the present invention, a current which does not contribute to oscillation, flows on both sides of a stripe region, that is, dummy stripes or regions are provided on both sides of the stripe region.

FIG. 4 is a plan view showing a representative structure of a semiconductor laser device according to the present invention. As shown in FIG. 4, dummy stripes 2 are provided on both sides of a stripe region. Hence, even in a case where a CW operation is performed and thus it is necessary to take the generation of heat into consideration, the temperature distribution in the stripe region is made uniform, and thus stable phase-locked oscillation can take place all over the stripe region. As a result, a laser beam which is excellent in coherency, is emitted even when the CW operation is performed.

BRIEF DESCRIPTION

FIG. 18A is a sectional view showing a semiconductor laser device which is used as the mother structure of the eighth embodiment of a semiconductor laser device according to the present invention.

FIGS. 18B and 18C show the refractive index distribution and gain distribution in the semiconductor laser device of FIG. 18A, respectively.

FIG. 19A is a sectional view showing a semiconductor laser device which is used as the mother structure of the ninth embodiment of a semiconductor laser device according to the present invention.

FIGS. 19B and 19C show the refractive index distribution and gain distribution in the semiconductor laser device of FIG. 19A, respectively.

DESCRIPTION OF THE PREFERRED EMBODIMENTS

Embodiments of the present invention will be explained below in detail, with reference to FIGS. 4 to 20C.

EMBODIMENT 1

Explanation will be made of the first embodiment of a semiconductor laser device according to the present invention, with reference to FIGS. 4, 5A and 5B.

Figure 1:
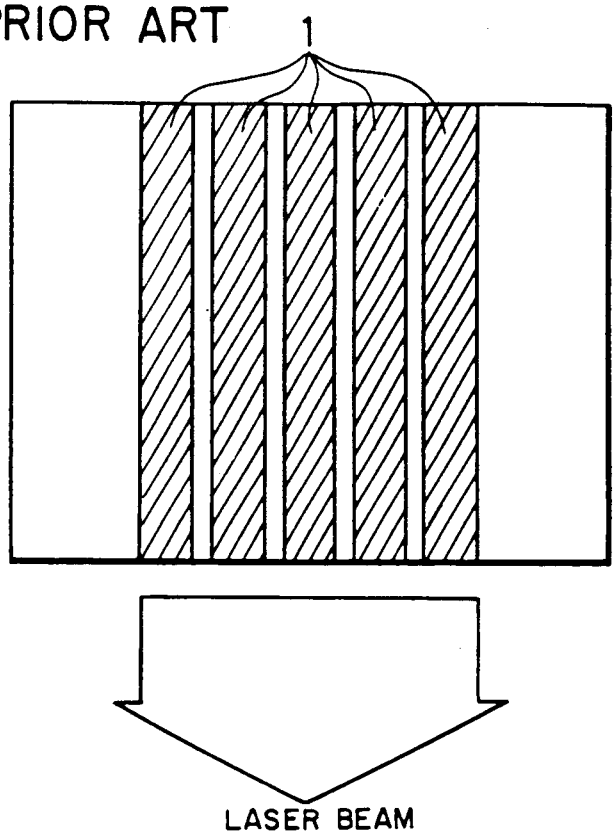
FIG. 1 is a schematic diagram showing the pulsed operation of a conventional phased-array semiconductor laser device.
Figure 2:
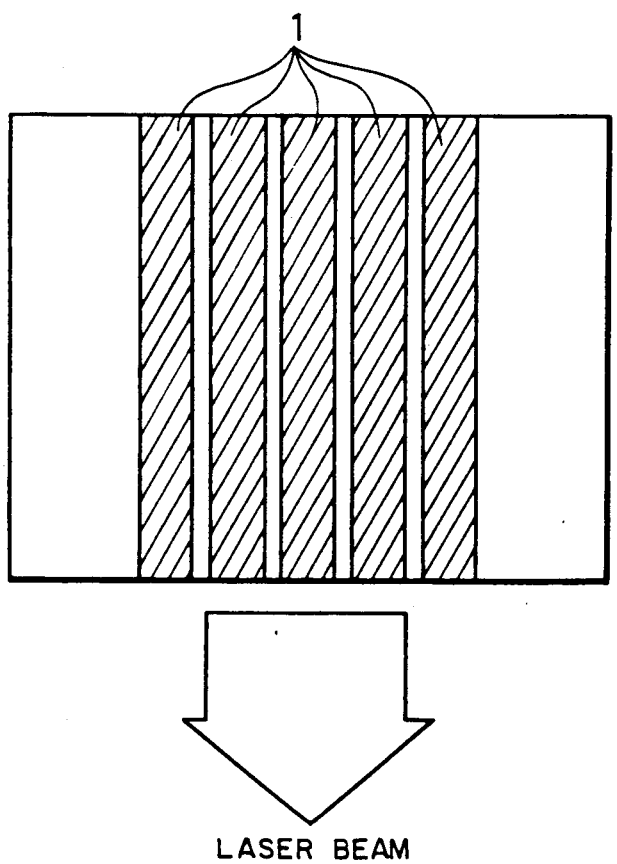
FIG. 2 is a schematic diagram showing the CW operation of the conventional phased-array semiconductor laser device.
Figure 3A:
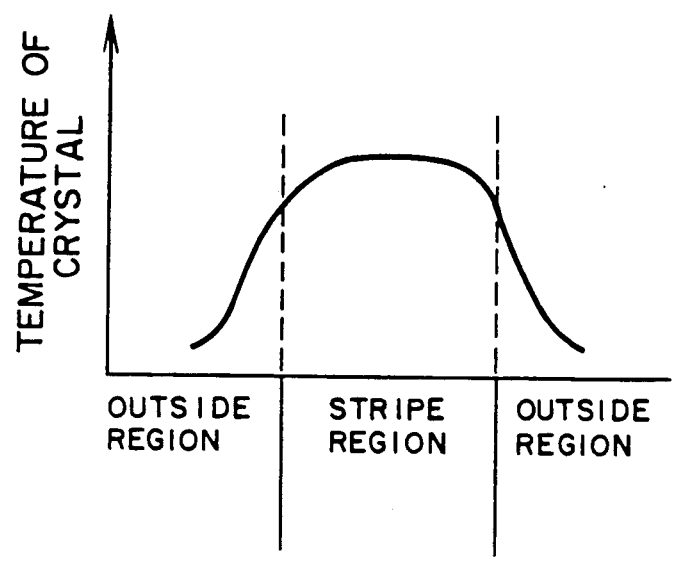
FIG. 3A is a graph showing the temperature distribution in the conventional phased-array semiconductor laser device.
Figure 3B:
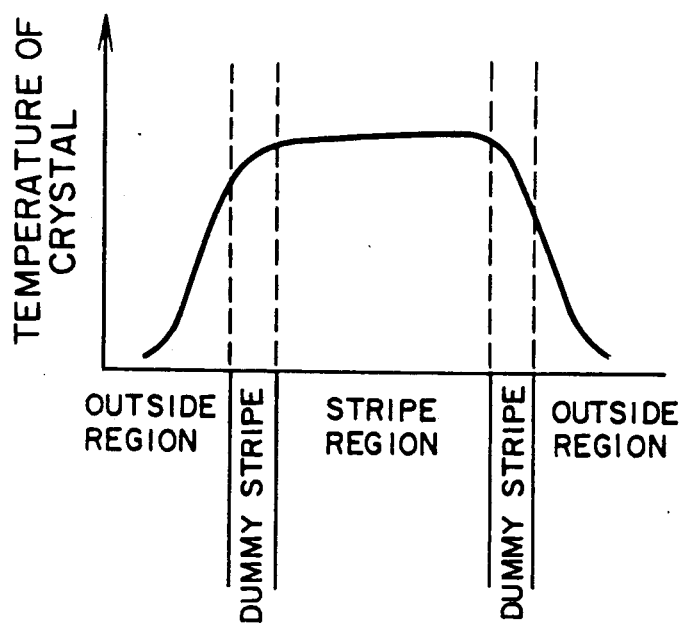
FIG. 3B is a graph showing the temperature distribution in an inventive semiconductor laser device provided with dummy stripes.
Figure 4:
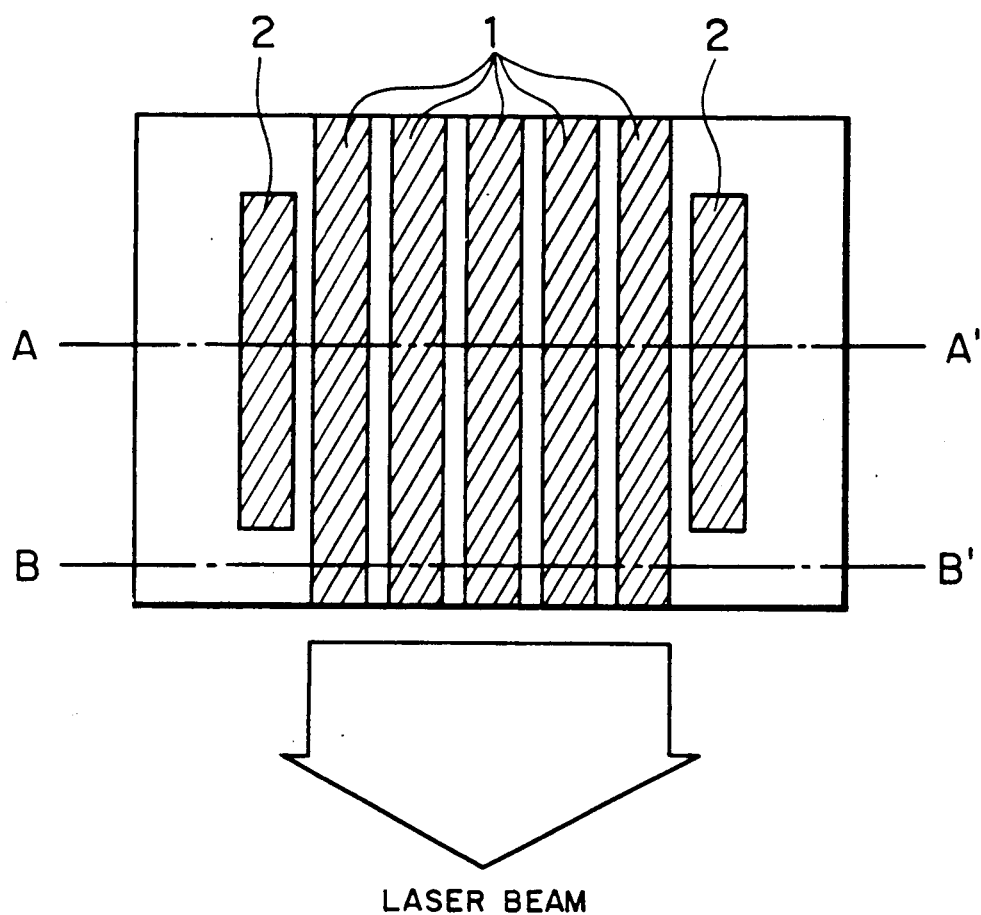
FIG. 4 is a plan view showing a representative structure of an inventive semiconductor laser device, that is, showing the first embodiment of a semiconductor laser device according to the present invention.

FIG. 4 is a plan view showing the first embodiment, and indicates the arrangement of stripes. FIG. 5A is a sectional view taken along the line A—A' of FIG. 4, that is, shows a cross section of that part of the first embodiment where dummy stripes exist. FIG. 5B is a sectional view taken along the line B—B' of FIG. 4, that is, shows a cross section of that part of the first embodiment where the dummy stripes do not exist.

Figure 5A:
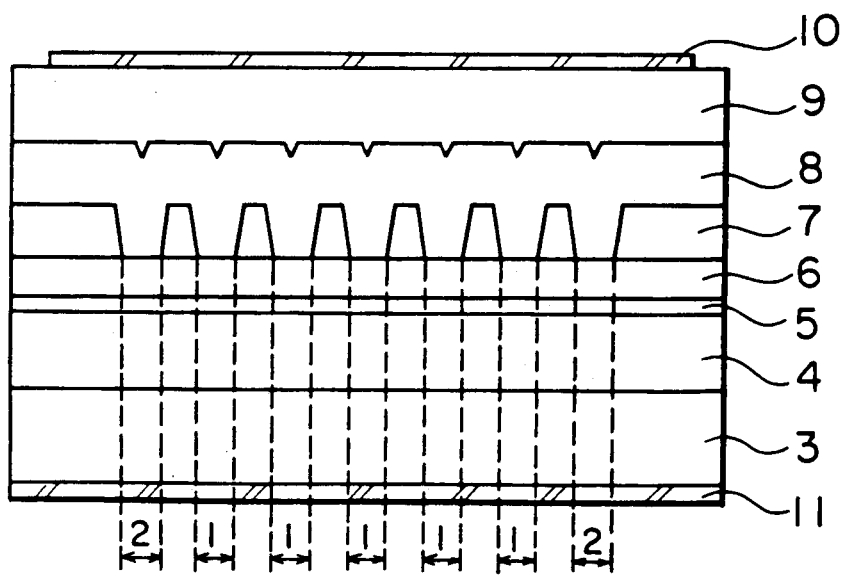
FIG. 5A is a sectional view taken along the line A—A' of FIG. 4.
Figure 5B:
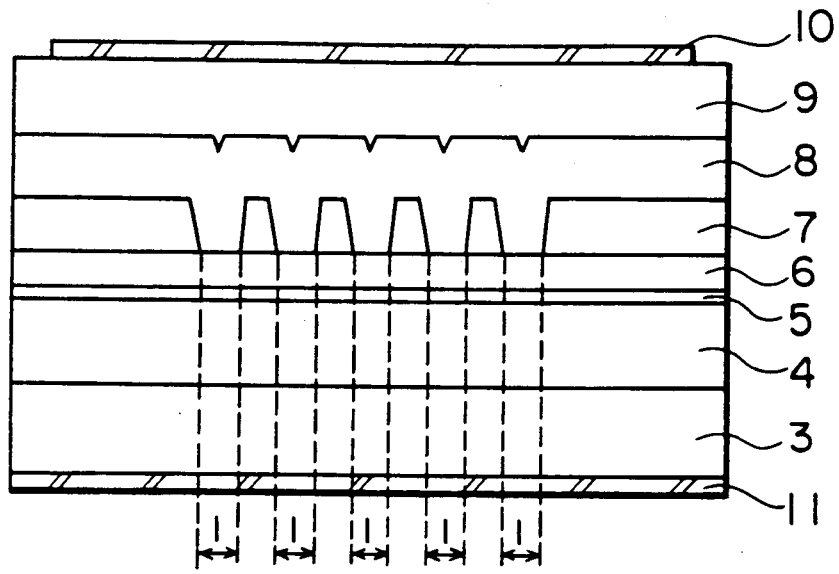
FIG. 5B is a sectional view taken along the line B—B' of FIG. 4.

Referring to FIGS. 5A and 5B, an n-$Al_{0.37}Ga_{0.67}As$ cladding layer 4, an $Al_{0.06}Ga_{0.94}As$ active layer 5, a p-$Al_{0.37}Ga_{0.63}As$ cladding layer 6 and an n-GaAs layer 7 for narrowing a current path are successively piled on an n-GaAs substrate 3 by the MBE (molecular beam epitaxy) method. Then, 2 to 20 grooves each extended in the direction of cavity length and having a width of 1 to 10 μm for forming stripes 1 are made with a spacing of 0.5 to 5 μm between adjacent grooves, through photoetching techniques so that the n-GaAs current-path narrowing layer 7 is completely etched off and the surface of the p-$Al_{0.37}Ga_{0.63}As$ cladding layer 6 is exposed. Further, grooves for forming dummy stripes 2 are provided on both sides of a stripe region containing the stripes 1. At this time, the width of each dummy stripe is put in a range from 4 to 6 μm, and each dummy stripe is spaced apart from a confronting outermost stripe a distance of 4 to 6 μm. Further, the dummy stripes 2 are not provided in that portion of the first embodiment which has a depth of 20 to 40 μm from each of the front and rear facets of the present embodiment. Next, a p-$Al_{0.37}Ga_{0.63}As$ cladding layer 8 for filling up the grooves and a p-GaAs cap layer 9 are formed by the MBE method. Thereafter, a positive electrode 10 and a negative electrode 11 are formed. The structure thus obtained is cleaved so as to form a laser device having a cavity length of about 300 μm.

The above laser device was able to generate a continuous wave having a wavelength of 830 nm, at room temperature. In a case where three stripes were formed in the laser device, the threshold current was equal to 100 mA. Further, the value of threshold current was 200 mA, 300 mA and 550 mA for the formation of six stripes, ten stripes and twenty stripes, respectively. The transverse mode of oscillation in this laser device was a stable single mode, and phase locked oscillation took place all over the stripe region.

EMBODIMENT 2

Figure 6:
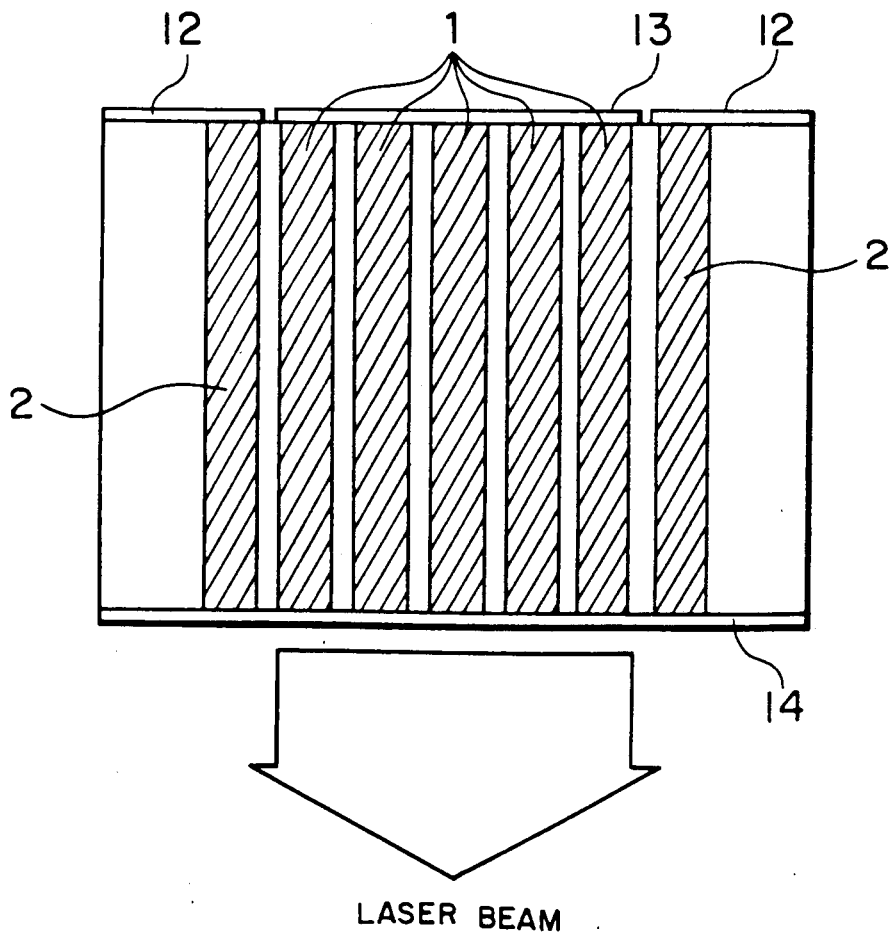
FIG. 6 is a plan view showing the second embodiment of a semiconductor laser device according to the present invention.
Figure 7:
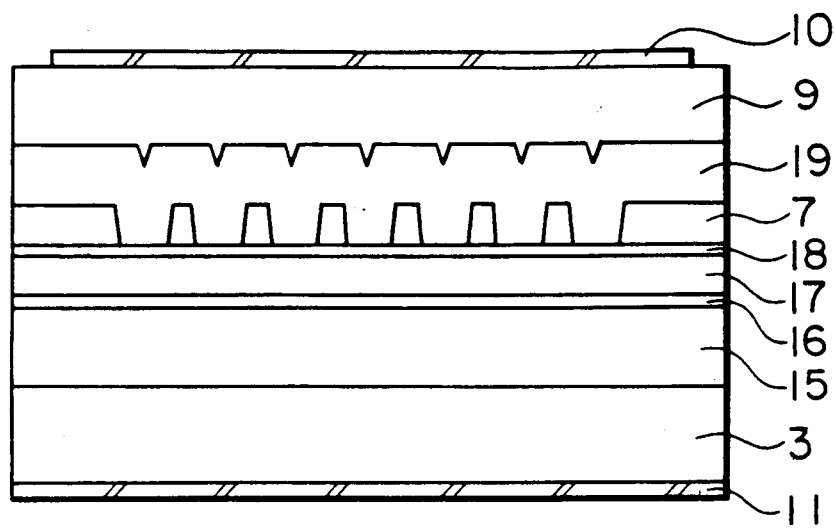
FIG. 7 is a sectional view showing the second embodiment.

Next, explanation will be made of the second embodiment of a semiconductor laser device according to the present invention, with reference to FIGS. 6 and 7. FIG. 6 is a plan view showing the second embodiment, and indicates the arrangement of stripes. FIG. 7 is a sectional view of the second embodiment.

Referring to FIG. 7, an n-$Al_{0.5}Ga_{0.50}As$ cladding layer 15, an $Al_{0.14}Ga_{0.86}As$ active layer 16, a p-$Al_{0.5}Ga_{0.5}As$ cladding layer 17, a p-$Al_{0.30}Ga_{0.70}As$ layer 18 for improving the bottom structure of a GaAs layer, and an n-GaAs 7 for narrowing a current path are successively piled on an n-GaAs substrate 3 by the MOCVD (metalorganic chemical vapor deposition) method. Then, 2 to 20 grooves each extended in the direction of cavity length and having a width of 1 to 10 μm for forming stripes are made with a spacing of 0.5 to 5 μm between adjacent grooves, through photoetching techniques so that the current-path narrowing layer 7 is completely etched off and the surface of the p-$Al_{0.30}Ga_{0.70}As$ layer 18 is exposed. Further, grooves for forming dummy stripes 2 are provided on both sides of a stripe region containing the stripes 1. At this time, the width of each dummy stripe is put in a range from 4 to 6 μm, and each dummy stripe is spaced apart from a confronting outermost stripe a distance of 4 to 6 μm. Next, a p-$Al_{0.60}Ga_{0.40}As$ layer 19 for filling up the grooves and a p-GaAs cap layer 9 are formed by the MOCVD method. Thereafter, a positive electrode 10 and a negative electrode 11 are formed. The structure thus obtained is cleaved so as to form a laser device having a cavity length of about 300 μm. Thereafter, the front facet of the laser device is coated with a low reflecting film 14 having a reflectivity RL, and that area of the rear facet which corresponds to the stripe region, is coated with a highly reflecting film 13 having a reflectivity RH. Further, that area of the rear facet which corresponds to a dummy stripe region, is coated with a reflecting film 12 having a reflectivity lower than the reflectivity RH.

The laser diode thus obtained was able to generate a continuous wave having a wavelength of 830 nm, at room temperature. The value of threshold current was 100 mA, 200 mA, 300 mA and 550 mA for the formation of three stripes, six stripes, ten stripes and twenty stripes, respectively. Further, the transverse mode of oscillation in the laser device was a stable single mode, and phase locked oscillation took place all over the stripe region.

EMBODIMENT 3

Figure 8:
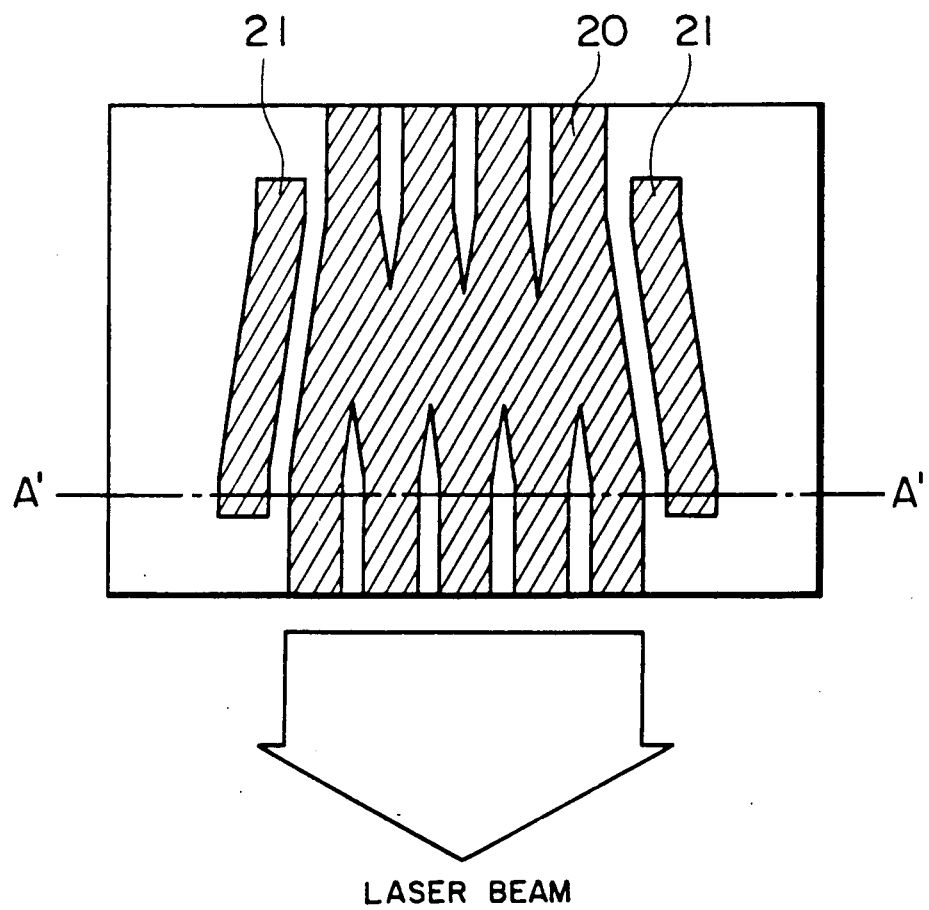
FIG. 8 is a plan view showing the third embodiment of a semiconductor laser device according to the present invention.
Figure 9:
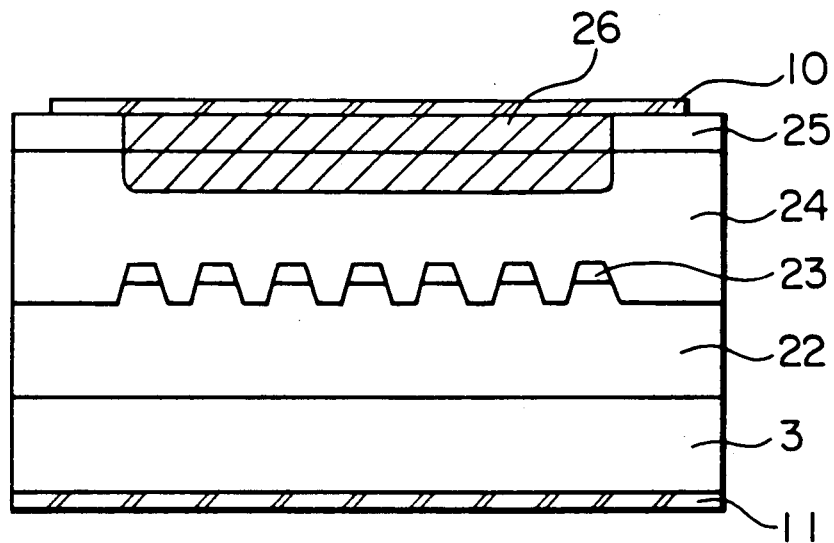
FIG. 9 is a sectional view taken along the line A—A' of FIG. 8.

Explanation will be made of the third embodiment of a semiconductor laser device according to the present invention, with reference of FIGS. 8 and 9. FIG. 8 is a plan view showing the third embodiment and indicates the arrangement of stripes. FIG. 9 is a sectional view taken along the line A—A' of FIG. 8.

Referring to FIG. 9, an n-$Al_{0.14}Ga_{0.50}As$ cladding layer 22 and an $Al_{0.14}Ga_{0.86}As$ active layer 23 are successively piled on an n-GaAs substrate 3 by the MOCVD method. Then, selective etching is carried out for the layers 23 and 22 through photoetching techniques so that the active layer 23 is completely etched off and the cladding layer 22 is etched to a predetermined depth, to form stripes 20 as shown in FIG. 8 and to form dummy stripes 21 on both sides of a stripe region. At this time, each dummy stripe is formed so as to have a width of 4 to 6 $\mu$m and to be spaced apart from a confronting outermost stripe a distance of 4 to 6 $\mu$m. Although it is shown in FIG. 8 that four stripes are coupled with five stripes through Y-shaped portions, 2 to 20 stripes may be formed. Each stripe is formed so as to have a width of 1 to 10 $\mu$m. Next, a a-$Al_{0.50}Ga_{0.50}As$ cladding layer 24 for filling up etched portions, and an n-GaAs cap layer 25 are formed by the MOCVD method. Thereafter, zinc is diffused into a portion which exists over the stripe region and dummy stripe region. Reference numeral 26 in FIG. 9 designates a zinc diffused region. Then, a positive electrode 10 and a negative electrode 11 are formed. The structure thus obtained is cleaved so as to form a laser device having a cavity length of about 300 $\mu$m.

The laser device was able to generate a continuous wave having a wavelength of 830 nm, at room temperature. The value of threshold current was 100 mA, 200 mA, 300 mA and 550 mA for the formation of three stripes, six stripes, ten stripes and twenty stripes, respectively. Further, the transverse mode of oscillation in the laser device was a stable single mode, and phase locked oscillation took place all over the stripe region.

EMBODIMENT 4

Figure 10:
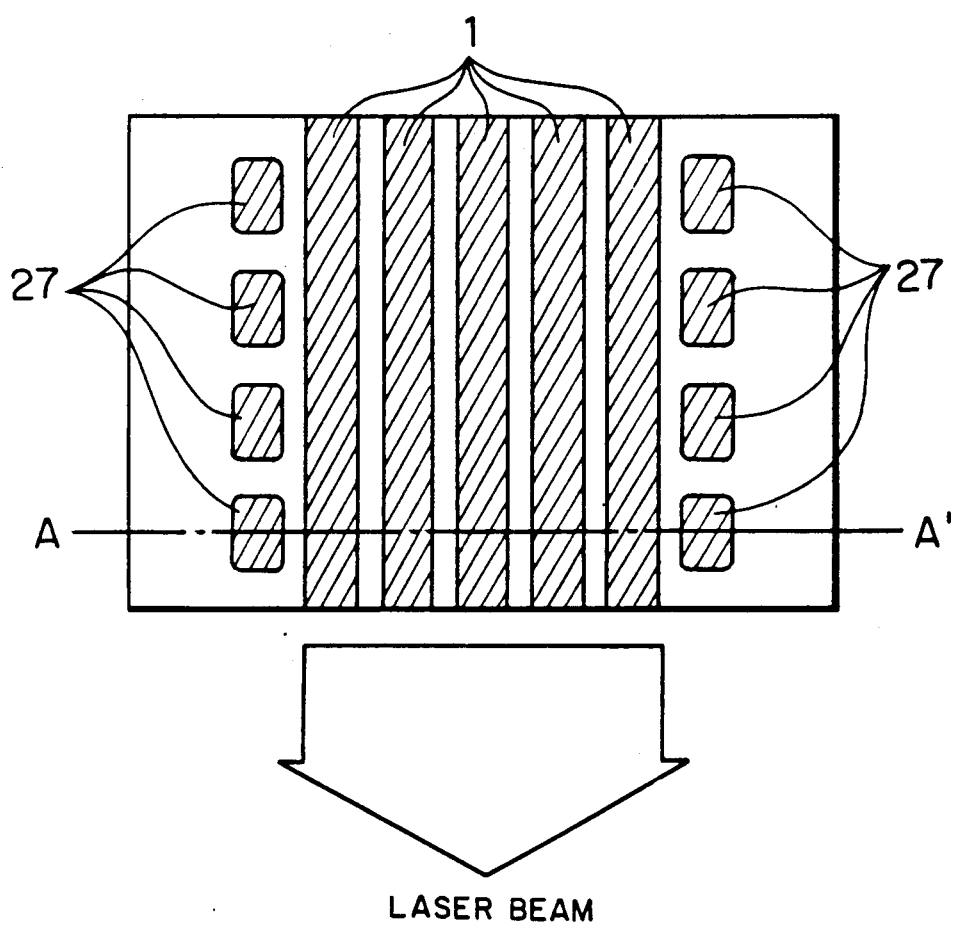
FIG. 10 is a plan view showing the fourth embodiment of a semiconductor laser device according to the present invention.

Explanation will be made of the fourth embodiment of a semiconductor laser device according to the present invention, with reference to FIGS. 10 and 11. FIG. 10 is a plan view showing the fourth embodiment, and FIG. 11 is a sectional view taken along the line A—A' of FIG. 10.

Figure 11:
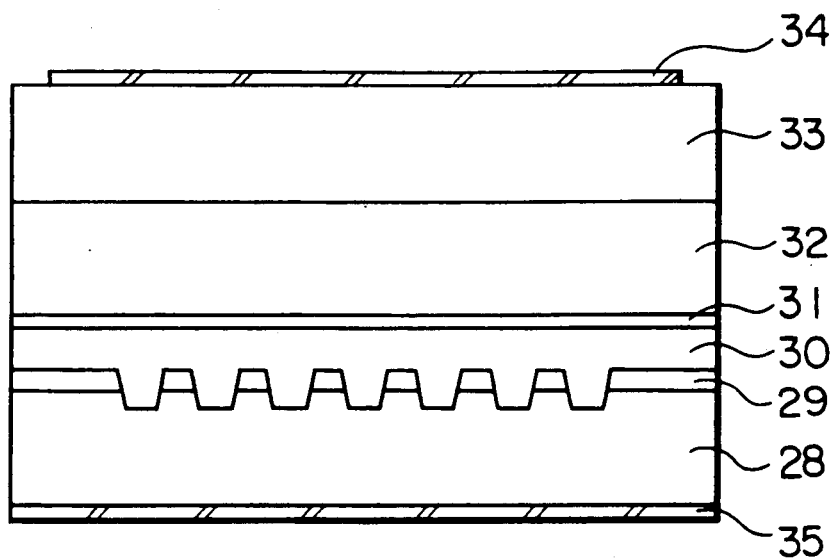
FIG. 11 is a sectional view taken along the line A—A' of FIG. 10.

Referring to FIG. 11, an n-GaAs layer 29 for narrowing a current path is formed on a p-GaAs substrate 28 by the MOCVD method. Next, 2 to 20 grooves each having a width of 1 to 10 $\mu$m for forming stripes are provided through photoetching techniques so that the current-path narrowing layer 29 is completely etched off and the substrate 28 is etched to a predetermined depth. Further, dummy portions 27 for transmitting a current which does not contribute oscillation, are provided on both sides of a stripe region. Each of the dummy portions has a width of 4 to 5 $\mu$m, and has a length of 20 to 30 $\mu$m in the direction of cavity length. As shown in FIG. 10, the dummy portions are arranged so as to be spaced apart from a confronting outermost stripe a distance of 4 to 6 $\mu$m and to be spaced apart from each other a distance of 10 $\mu$m in the direction of cavity length. Next, a p-$Al_{0.50}Ga_{0.50}As$ cladding layer 30, an $Al_{0.14}Ga_{0.86}As$ active layer 31, an n-$Al_{0.50}Ga_{0.50}As$ cladding layer 32 and an n-GaAs cap layer 33 are successively formed by the LPE (liquid phase epitaxy) method. Thereafter, a negative electrode 34 and a positive electrode 35 are formed. The structure thus obtained is cleaved so as to form a laser device having a cavity length of about 300 $\mu$m.

The laser device was able to generate a continuous wave having a wavelength of 830 nm, at room temperature. The value of threshold current was 100 mA, 200 mA, 300 mA and 550 mA for the formation of three stripes, six stripes, ten stripes and twenty stripes, respectively. Further, the transverse mode of oscillation in the laser device was a stable single mode, and phase locked oscillation took place all over the stripe region.

Next, explanation will be made of other embodiments, in which a current can be injected into a dummy stripe region independently of a current flowing through a stripe region.

EMBODIMENT 5

Figure 12:
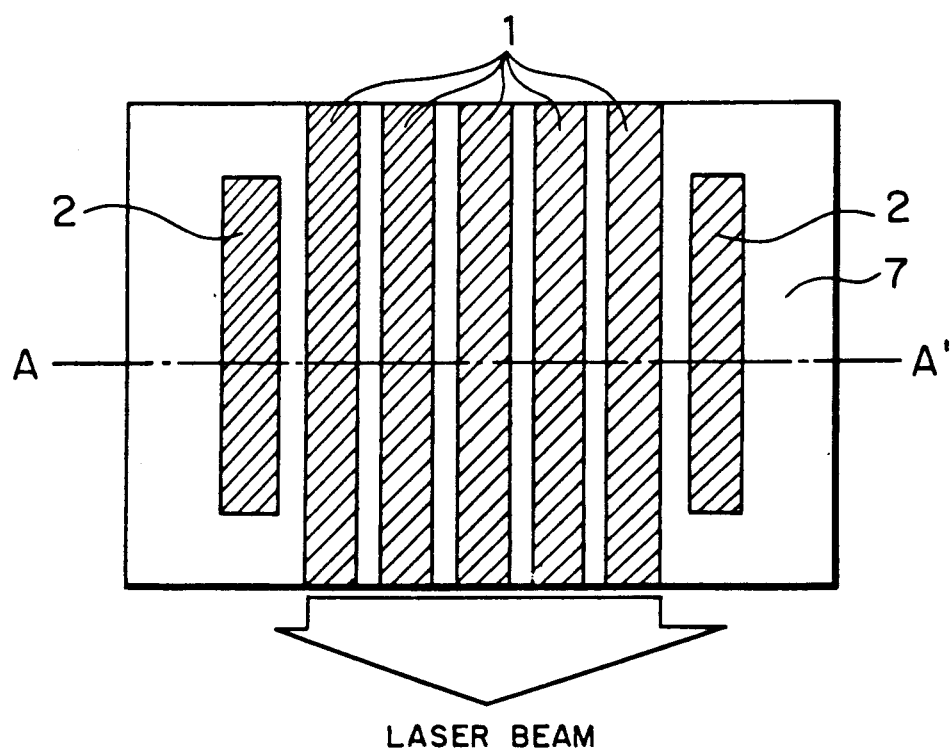
FIG. 12 is a plan view showing the fifth embodiment of a semiconductor laser device according to the present invention.
Figure 12A:
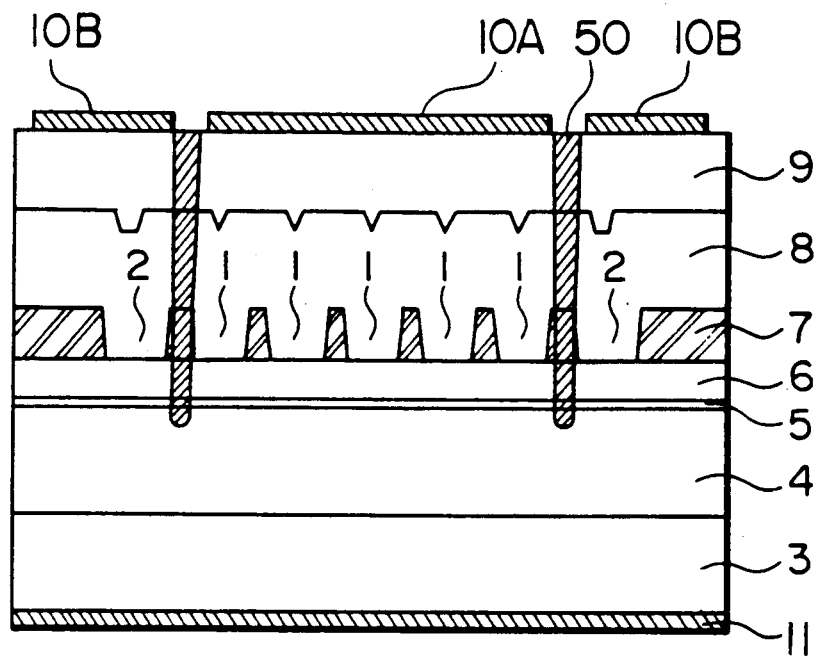
FIG. 12A is a sectional view taken along the line A—A' of FIG. 12.

Explanation will be made of the fifth embodiment of a semiconductor laser device according to the present invention, with reference to FIGS. 12 and 12A. FIG. 12 is a plan view showing the fifth embodiment, and indicates the arrangement of stripes. FIG. 12A is a sectional view taken along the line A—A' of FIG. 12, that is, shows a cross section of that part of the fifth embodiment where dummy stripes 2 exist.

Referring to FIG. 12A, an n-$Al_{0.37}Ga_{0.63}As$ cladding layer 4, an $Al_{0.06}Ga_{0.94}As$ active layer 5, a p-$Al_{0.37}Ga_{0.63}As$ cladding layer 6 and an n-GaAs layer 7 for narrowing a current path are successively piled on an n-GaAs substrate 3 by the MBE method. Then, 2 to 20 grooves each extended in the direction of cavity length and having a width of 1 to 10 $\mu$m for forming stripes 1 are made with a spacing of 0.5 to 5 $\mu$m between adjacent grooves, through photoetching techniques so that the current-path narrowing layer 7 is completely etched off and the surface of the cladding layer 6 is exposed. Further, grooves for forming dummy stripes 2 are provided on both sides of a stripe region containing the stripes 1. At this time, the dummy stripes 2 are formed so that each dummy stripe has a width of 4 to 6 $\mu$m and is spaced apart from a confronting outermost stripe a distance of 4 to 6 $\mu$m. Further, the dummy stripes 2 are not formed in that portion of the present embodiment which has a depth of 20 to 40 $\mu$m from each of the front and rear facets of the present embodiment. Next, a p-$Al_{0.37}Ga_{0.63}As$ cladding layer 8 for filling up the grooves and a p-GaAs cap layer 9 are formed by the MBE method. Thereafter, a positive electrode layer is deposited to form an electrode 10A for the stripe region and an electrode 10B for a dummy stripe region by the lift-off method.

As mentioned above, the electrode 10A for the stripe region is separated from the electrode 10B for the dummy stripe region. Thus, a current supplied to the dummy stripe region can be controlled independently of a current supplied to the stripe region.

In order to separate the current flowing through the dummy stripe region, completely from the current flowing through the stripe region, it is necessary to provide isolation regions 50, which can be formed by carrying out proton implantation while using the electrodes 10a and 10B as a mask. Thereafter, a negative electrode 11 is formed. The structure thus obtained is cleaved so as to form a laser device having a cavity length of about 300 $\mu$m.

The laser device was able to generate a continuous wave having a wavelength of 830 nm, at room temperature. The value of threshold current was 100 mA, 200 mA, 300 mA and 550 mA for the formation of three stripes, six stripes, ten stripes and twenty stripes, respectively. By supplying a current to the dummy stripe region in a period when a CW operation was performed, the transverse mode of oscillation became a stable single mode, that is, phase locked oscillation took place all over the stripe region. Further, in a case where a pulsed operation was performed, phase locked oscillation took place all over the stripe region and the transverse mode of oscillation was a stable single mode, independently of whether or not a current was supplied to the dummy stripe region.

EMBODIMENT 6

Figure 13:
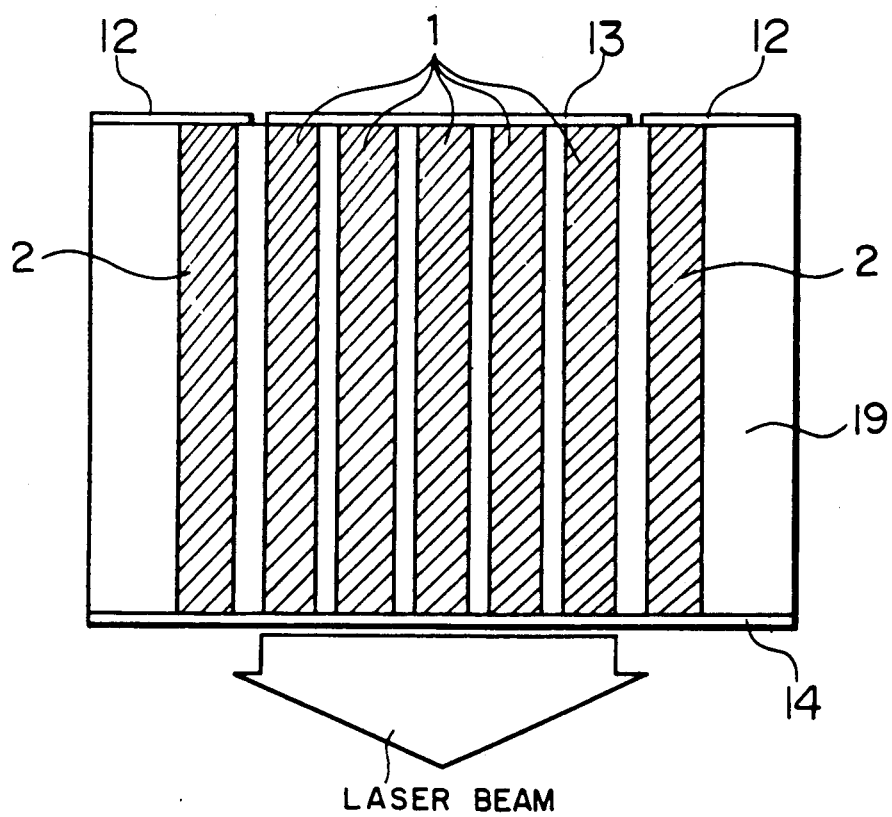
FIG. 13 is a plan view showing the sixth embodiment of a semiconductor laser device according to the present invention.
Figure 13A:
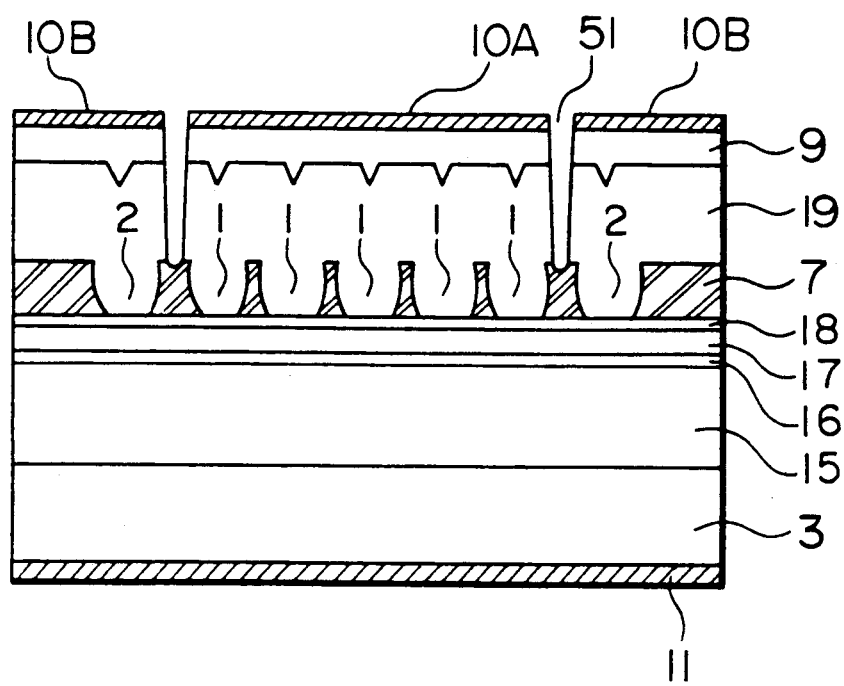
FIG. 13A is a sectional view showing the sixth embodiment.

Explanation will be made of the sixth embodiment of a semiconductor laser device according to the present invention, with reference to FIGS. 13 and 13A. FIG. 13 is a plan view showing the sixth embodiment, and indicates the arrangement of stripes. FIG. 13A is a sectional view of the present embodiment.

Referring to FIG. 13A, an n-$Al_{0.50}Ga_{0.50}As$ cladding layer 15, an $Al_{0.14}Ga_{0.86}As$ active layer 16, a p-$Al6hd 0.50Ga_{0.50}As$ cladding layer 17, a p-$Al_{0.30}Ga_{0.70}As$ layer 18 for improving the bottom structure of a GaAs layer, and an n-GaAs layer 7 for narrowing a current path are successively piled on an n-GaAs substrate 3 by the MOCVD method. Then, 2 to 20 grooves each extended in the direction of cavity length and having a width of 1 to 10 μm for forming stripes 1 are made with a spacing of 0.5 to 5 μm between adjacent grooves, through photoetching techniques so that the current-path narrowing layer 7 is completely etched off and the surface of the bottom-structure improving layer 18 is exposed. Further, grooves for forming dummy stripes 2 are provided on the both sides of a stripe region containing the stripes 1. At this time, the dummy stripes 2 are formed so that each dummy stripe has a width of 4 to 6 μm and is spaced apart from a confronting outermost stripe a distance of 4 to 6 μm. Next, a p-$Al_{0.60}Ga_{0.40}As$ cladding layer 19 for filling up the grooves, and a p-GaAs cap layer 9 are formed by the MOCVD method. Thereafter, a positive electrode layer is deposited to form an electrode 10A for the stripe region and an electrode 10B for a dummy stripe region by the lift-off method.

As mentioned above, the electrode 10A for the stripe region is separated from the electrode 10B for the dummy stripe region. Thus, a current supplied to the dummy stripe region can be controlled independently of a current supplied to the stripe region.

In order to separate the current flowing through dummy stripe region, completely from the current flowing through the stripe region, it is necessary to provide isolation regions 51, which can be formed by carrying out selective etching to a depth capable of reaching the current-path narrowing layer 7 while using the electrodes 10A and 10B as a mask. At this time, the dry etching method is used, since side etching is scarcely generated. Thereafter, a negative electrode 11 is formed. The structure thus obtained is cleaved so as to form a laser device having a cavity length of about 300 μm. Referring to FIG. 13, the front facet of the laser device is coated with a low reflecting film 14 having a reflectivity RL, and that area of the rear facet which corresponds to the stripe region, is coated with a highly reflecting film 13 having a reflectivity RH. Further, that area of the rear facet which corresponds to the dummy stripe region, is coated with a reflecting film 12 which is lower in reflectivity than the highly reflecting film 13. The laser device thus obtained was able to generate a continuous wave having a wavelength of 780 nm, at room temperature. The value of threshold current was 100 mA, 200 mA, 300 mA and 550 mA for the formation of three stripes, six stripes, ten stripes and twenty stripes, respectively. By supplying a current to the dummy stripe region in a period when a CW operation was performed, the transverse mode of oscillation became a stable single mode. Further, in a case where a pulsed operation was performed, phase locked oscillation took place all over the stripe region and the transverse mode of oscillation was a stable single mode, independently of whether or not a current was supplied to the dummy stripe region.

EMBODIMENT 7

Figure 14:
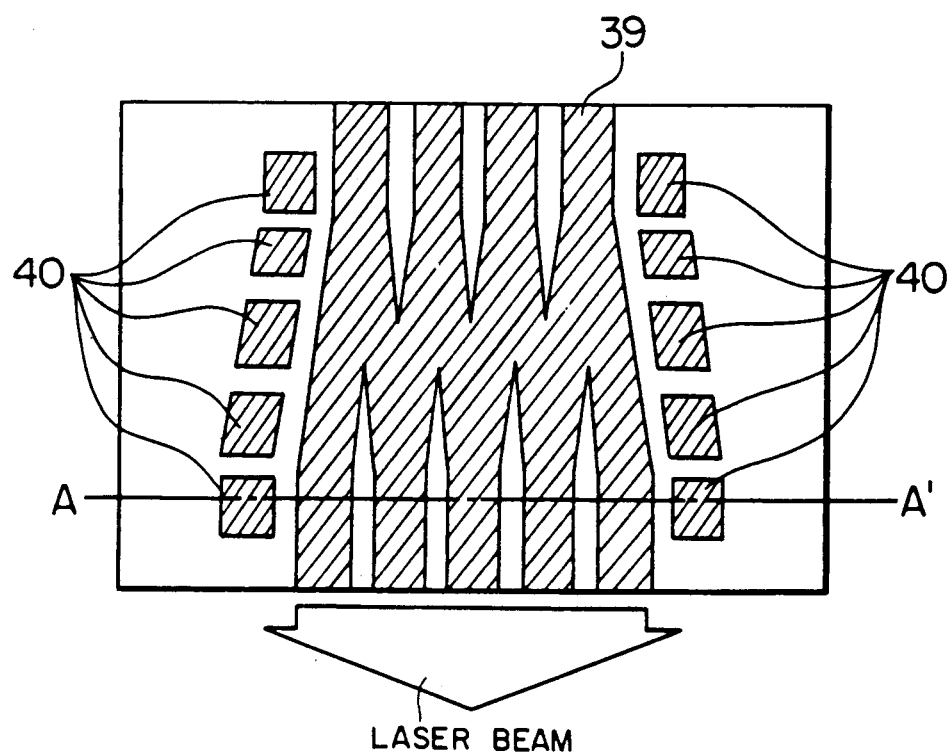
FIG. 14 is a plan view showing the seventh embodiment of a semiconductor laser device according to the present invention.
Figure 14A:
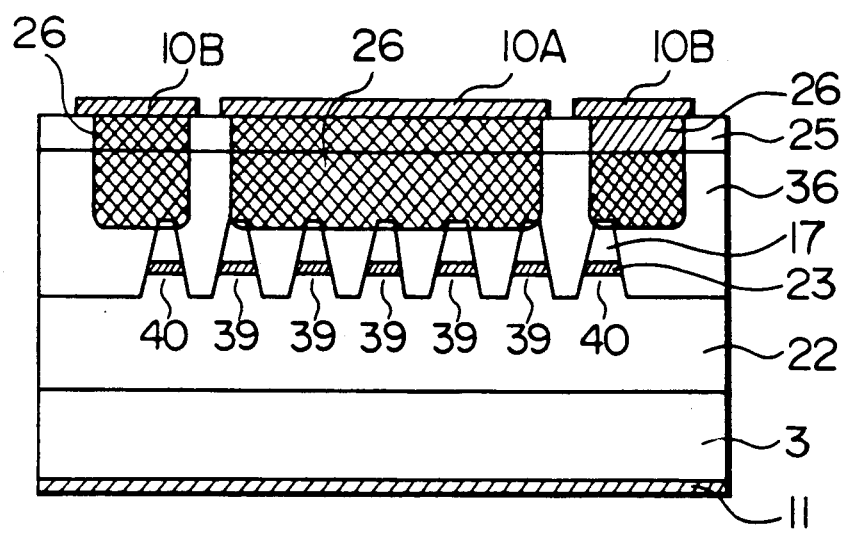
FIG. 14A is a sectional view taken along the line A—A' of FIG. 14.

Explanation will be made of the seventh embodiment of a semiconductor laser device according to the present invention, with reference to FIGS. 14 and 14A. FIG. 14 is a plan view showing the seventh embodiment, and indicates the arrangement of stripes. FIG. 14A is a sectional view taken along the line A—A' of FIG. 14.

Referring to FIG. 14A, an n-$Al_{0.14}Ga_{0.50}As$ cladding layer 22, an $Al_{0.14}Ga_{0.86}As$ active layer 23 and a p-$Al_{0.50}Ga_{0.50}As$ cladding layer 17 are successively piled on an n-GaAs substrate 3 by the MOCVD method. Next, selective etching is carried out through photoetching techniques so that the active layer 23 is completely etched out and the cladding layer 22 is etched to a predetermined depth, to form stripes 39 as shown in FIG. 14. Further, dummy stripes 40 for transmitting a current which does not contribute to oscillation, are provided on both sides of a stripe region containing the stripes 39. Each of the dummy stripes 40 has a width of 4 to 5 μm, and has a length of 20 to 30 μm in the direction of cavity length As shown in FIG. 14, the dummy stripes 40 are arranged so as to be spaced apart from a confronting outermost stripe a distance of 4 to 6 μm and to be spaced apart from each other a distance of 10 μm in the direction of cavity length. Although it is shown in FIG. 14 that four stripes are coupled with five stripes through Y-shaped portions, 2 to 20 stripes may be formed. Each of the stripes 39 has a width of 1 to 10 μm. Next, a slightly-doped (or undoped) $Al_{0.50}Ga_{0.5}As$ cladding layer 36 for filling up grooves, and an n-GaAs cap layer 25 are formed by the MOCVD method. Thereafter, zinc is diffused into a portion which exists on the stripe region, and a portion which exists on the dummy stripe portion, to form zinc diffused regions 26. Then, a positive electrode layer is deposited, to form an electrode 10A for the stripe region and an electrode 10B for the dummy stripe region by the lift-off method Thus, a current can be supplied to the dummy stripe region independently of a current supplied to the stripe region Thereafter, a negative electrode 11 is formed The structure thus obtained is cleaved so as to form a laser device having a cavity length of about 300 μm.

The laser device was able to generate a continuous wave having a wavelength 780 nm, at room temperature. The value of threshold current was 100 mA, 200 mA, 300 mA and 550 mA for the formation of three stripes, six stripes, ten stripes and twenty stripes, respectively. By supplying a current the dummy stripe region in a period when a CW operation was performed, the transverse mode of oscillation became a stable single mode. Further, in a case where a pulsed operation was performed, phase locked oscillation took place all over the stripe region and the transverse mode of oscillation was a stable single mode, independently of whether or not a current was supplied to the dummy stripe region.

The above-mentioned technical thought that dummy stripes are disposed on both sides of a stripe region, is applicable to semiconductor laser devices of all kinds including the single lobe type and the double lobe type. Although semiconductor laser devices usually generate a double lobed for field pattern, it is desirable to generate a single lobed far field pattern. Accordingly, a semiconductor laser device obtained by applying the above technical thought to a semiconductor laser device of the single lobe type, will be the most practical device.

Now, explanation will be made of a semiconductor laser device of the single lobe type proposed by the present inventors. It is described in a Japanese patent application JP-A-62-147,791 that a current is injected into an interstripe portion sandwiched between stripes and having a low-refractive index, to form a single lobed far field pattern based upon oscillation of the fundamental mode. In this case, the single lobed far field pattern is obtained by suppressing the mode of the N-th order.

Figure 15:
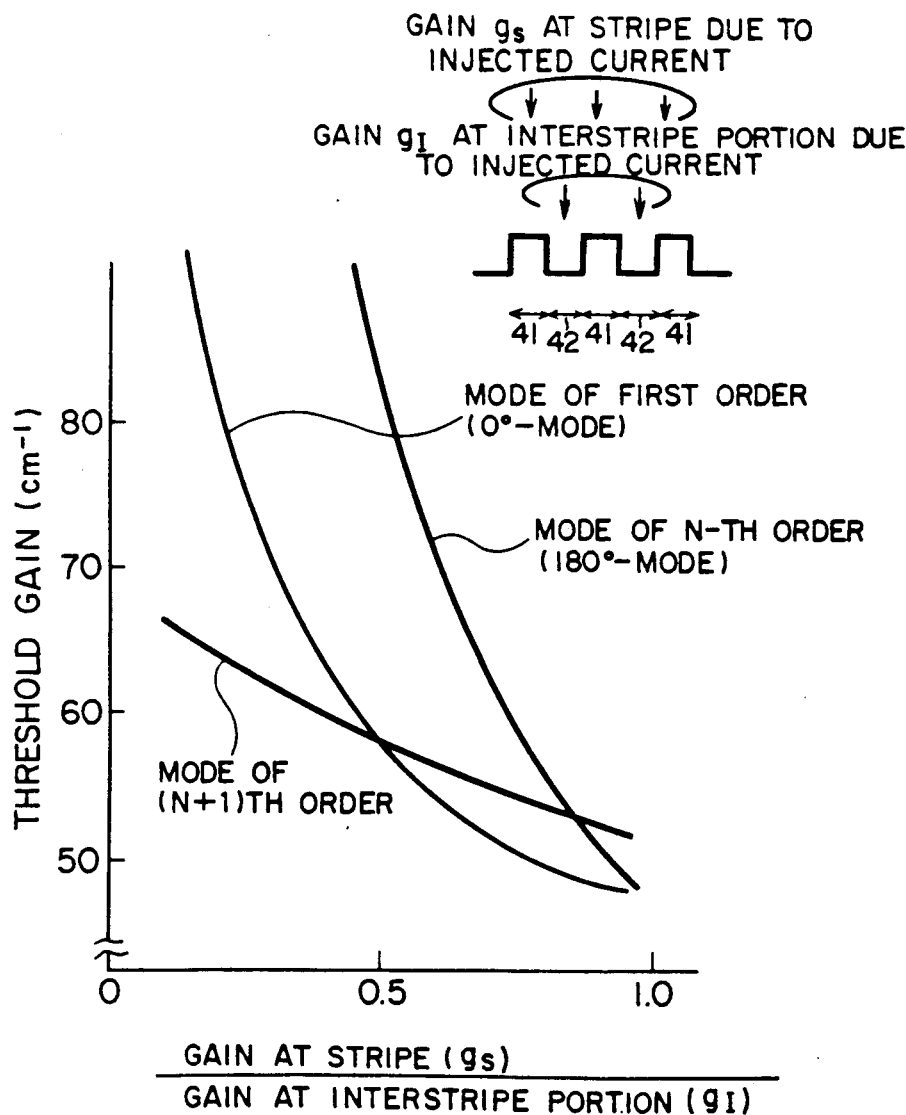
FIG. 15 is a graph showing relations between a ratio of the gain at a stripe to the gain at an interstripe portion and a threshold gain in a case where the (N+1)th order mode is not cut off.
Figure 16A:
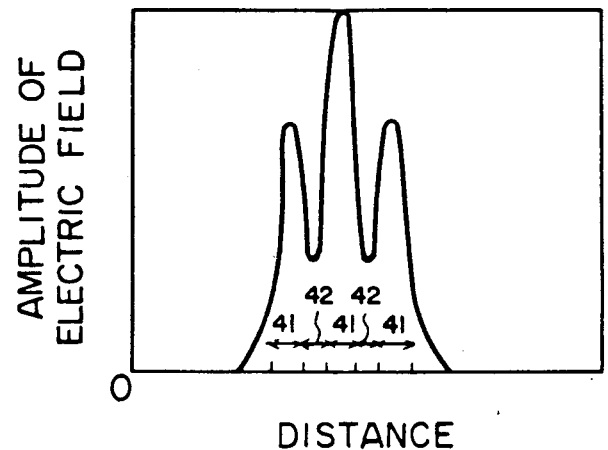
FIG. 16A is a graph showing the spatial distribution of the amplitude of electric field due to the first-order mode.
Figure 16B:
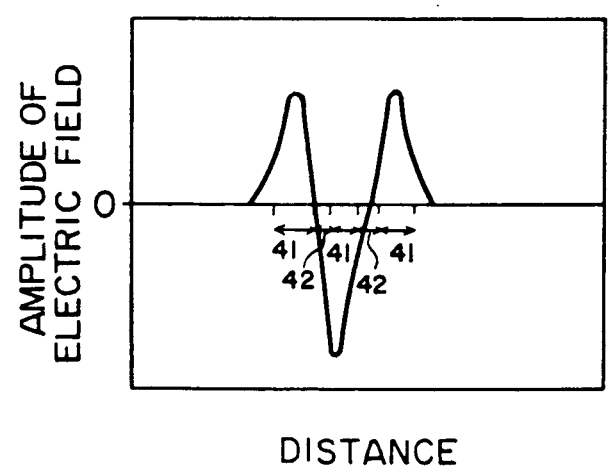
FIG. 16B is a graph showing the spatial distribution of the amplitude of electric field due to the N-th order mode.
Figure 16C:
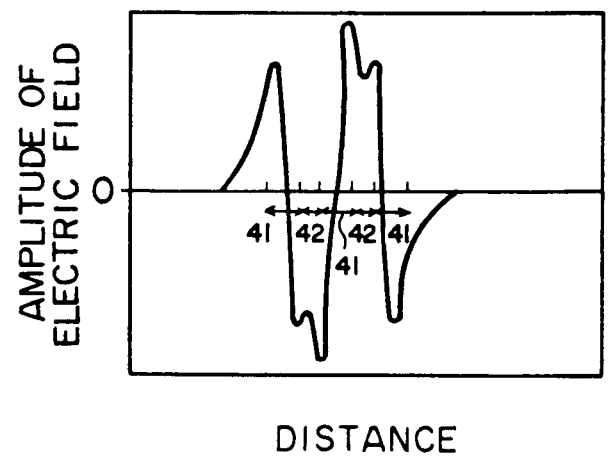
FIG. 16C is a graph showing the spatial distribution of the amplitude of electric field due to the (N+1)th order mode.

FIG. 15 shows relations between a ratio of the gain at each stripe to the gain at each interstripe portion having a low refractive index and a threshold gain. When the gain at each stripe is decreased to reduce the above ratio, the threshold gain of the mode of the N-th order is abruptly increased, but the threshold gain of the mode of the first order is gradually increased. That is, the mode of the N-th order can be suppressed by reducing the above ratio. The reason for this will be explained below. FIG. 16A shows the amplitude distribution of electric field due to the first-order mode, in a phased-array laser device. FIG. 16B shows the amplitude distribution of electric field due to N-th order mode, and FIG. 16C shows the amplitude distribution of electric field due to the (N+)th order mode. In FIGS. 15 and 16A to 16C, reference numeral 41 designates stripes, and 42 interstripe portions. In the first-order mode, adjacent stripes have the same oscillation phase, and thus the amplitude of electric field at a portion sandwiched between the stripes (namely, interstripe portion) is not equal to zero. Accordingly, when the ratio of the gain at the stripe to the gain at the interstripe portion is reduced, the threshold gain is increased only a little. While, in the N-th order mode, adjacent stripes are opposite in oscillation phase to each other, and thus the amplitude of electric field at the interstripe portion becomes equal to zero. That is, the electric field intensity at the interstripe portion is far weaker than the electric field intensity at the stripe. Accordingly, when the ratio of the gain at the stripe to the gain at the interstripe portion is reduced, the threshold gain is greatly increased. In the (N+)th order mode, oscillation of a higher mode is generated in each stripe. Thus, the amplitude of electric field becomes equal to zero in each stripe, and the amplitude of electric field at the interstripe portion is not equal to zero. That is, the electric field intensity at the interstripe portion is stronger than that in the first-order mode. Accordingly, when the ratio of the gain at the stripe to the gain at the interstripe portion is reduced, an increase in threshold gain will be smaller than that in the first-order mode. That is, the mode of the (N+1)th order is generated.

Figure 17A:
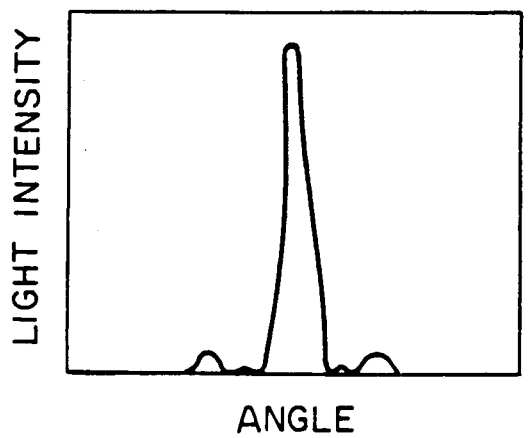
FIGS. 17A, 17B and 17C show far field patterns in the first order mode, the N-th order mode and the (N+1)th order mode, respectively.
Figure 17B:
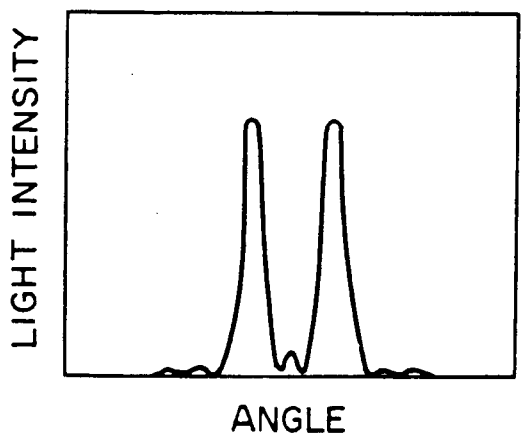
Figure 17C:
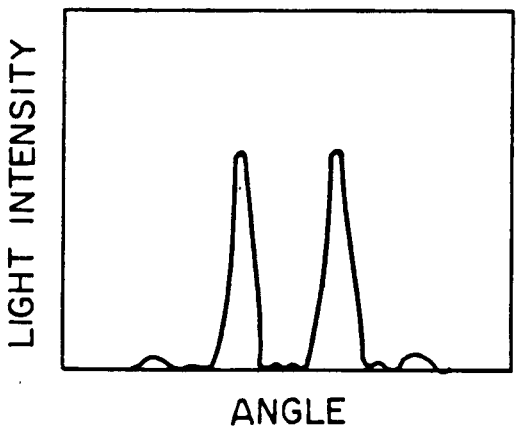

FIGS. 17a, 17B and 17C show the far field patterns of the first-order mode, the N-th order mode and the (N+1)th order mode, respectively. In the first-order mode, a single lobed pattern is formed as shown in FIG. 17a. While, in the N-th order mode and (N+1)th order mode, a double lobed pattern is formed which is undesirable from the practical point of view.

It is well known that the modes of the (N+1)th order and a higher order than the (N+1)th order can be suppressed in the semiconductor laser device of this kind by narrowing the width of each stripe. Further, it has been confirmed by the present inventors that in a case where a current injected into a stripe is decreased to reduce the gain at the stripe as mentioned above, the modes of the (N+1)th order and a higher order than the (N+1)th order can be suppressed by making the width of the stripe less than 3 μm.

That is, in a case where a semiconductor device includes a plurality of stripes each having a width less than 3 μm and a current injected into each stripe is reduced (or a current injected into each interstripe portion is increased), the mode of the N-th order is cut off on the basis of the threshold gain characteristic thereof shown in FIG. 15, and the modes of the (N+1)th order and a higher order than the (N+1)th order are cut off on the basis of the narrowing of each stripe. Thus, modes of the N-th order and a higher order than the N-th order are cut off, and a single lobed far field pattern is formed.

Now, explanation will be three examples of a semiconductor laser device of the single lobe type based upon the above technical thought, and the eighth to tenth embodiments of a semiconductor laser device according to the present invention which embodiments are obtained by adding a dummy stripe region to the above examples.

EMBODIMENT 8

Explanation will be made of the first example of a semiconductor laser device of the single lobe type which example is used as the mother structure of the eighth embodiment, with reference to FIGS. 18A to 18C.

FIG. 18A is a sectional view showing the first example. Referring to FIG. 18A, an n-$Al_{0.37}Ga_{0.63}As$ cladding layer 4, an $Al_{0.06}Ga_{0.94}As$ active layer 5, a p-$Al_{0.37}Ga_{0.63}As$ cladding layer 6 and an n-$Al_{0.37}Ga_{0.63}As$ layer 45 for narrowing a current path are successively piled on an n-GaAs substrate 3 by the MOCVD method. Then, 3 to 21 grooves each extended in the direction of cavity length and having a width of 0.5 to 5 μm for forming interstripe portions 62 are provided through photoetching techniques to that the current-path narrowing layar 45 is completely etched off and the surface of the p-$Al_{0.37}Ga_{0.63}As$ cladding layer 6 is exposed. Thus, a stripe 61 having a width of 1 to 2.9 μm is formed between adjacent grooves. Next, a p-$Al_{0.50}Ga_{0.5}As$ cladding layer 24 for filling up the grooves, and an n-GaAs cap layer 25 are formed by the MOCVD method. Thereafter, zinc is diffused into a region which exists over a stripe region, to form a zinc diffused region 26 including the cap layer 25 and a surface portion of the groove filling layer 24. Then, a positive electrode 10 and a negative electrode 11 are formed. The structure thus obtained is cleaved so as to form a laser having a cavity length of about 300 μm.

FIGS. 18B and 18C show the effective-index-of-refraction distribution and gain distribution in this laser device. A portion where the current-path narrowing layer 45 is left unetched, has a large effective index of refraction. Further, a current flows only in an interstripe portion, and a gain is obtained only at the interstripe portion.

The laser device was able to generate a continuous wave having a wavelengh of 830 nm, at room temperature. The value of threshold current was 100 mA, 200 mA and 300 mA for the formation of three stripes, six stripes and ten stripes, respectively. Further, in the laser device, oscillation took place stably in the first-order mode, and a single lobed far field pattern was obtained.

When a dummy stripe region is provided on both sides of the stripe region of the above semiconductor laser device of the single lobe type, and means for supplying a current which does not contribute to oscillation, to the dummy stripe region is provided, the eighth embodiment of an inventive semiconductor laser device is obtained.

EMBODIMENT 9

Explanation will be made of the second example of a semiconductor laser device of the single lobe type which example is used as the mother structure of the ninth embodiment of a semiconductor laser device according to the present invention, with reference to FIGS. 19A to 19C.

FIG. 19A is a sectional view showing the second example. Referring to FIG. 19A, an n-$Al_{0.37}Ga_{0.63}As$ cladding layer 4, an $A_{0.06}Ga_{0.94}As$ active layer 5, a p-$Al_{0.37}Ga_{0.63}As$ cladding layer 6, a p-GaAs absorption layer 67 and an n-GaAs layer 7 for narrowing a current path are successively piled on an n-GaAs substrate 3 by the MOCVD method. Then, a groove 63 for defining a stripe region is provided through photoetching techniques so that the current-path narrowing layer 7 is completely etched off and the surface of the absorption layer 67 is exposed. Thereafter, 3 to 21 grooves each extended in the direction of cavity length and having a width of 0.5 to 5 $\mu$m for forming interstripe portions 62 are provided through photoetching techniques so as to reach the surface of the p-$Al_{0.37}Ga_{0.67}As$ cladding layer 6. At this time, a portion sandwiched between adjacent grooves and having a width of 1 to 2.9 $\mu$m is formed as a stripe 61. Next, a p-$Al_{0.37}Ga_{0.63}As$ cladding layer 8 for filling up the grooves, and a p-GaAs cap layer 9 are formed by the MOCVD method. Then, a positive electrode 10 and a negative electrode 11 are formed. The structure thus obtained is cleaved so as to form a laser device having a cavity length of about 300 $\mu$m. FIGS. 19B and 19C show the effective-index of-refraction distribution and gain distribution in the above laser device, respectively. A portion where the absorption layer 67 is left unetched, has a large effective index of refraction, and forms a stripe 61. The current-path narrowing layer 7 is present on both sides of the stripe region 63. Hence, a current flows only in the stripe region 63. At the stripe 61, the absorption layer 63 is left unetched. Accordingly, the loss due to absorption is generated at the stripe. Thus, a gain is obtained only at the interstripe portion.

The above laser device was able to generate a continuous wave having a wavelength of 830 nm, at room temperature. The value of threshold current was 100 mA, 200 mA and 300 mA for the formation of three stripes, six stripes and ten stripes, respectively. Further, in the laser device, oscillation took place stably in the first-order mode, and a single lobed far field pattern was obtained.

By providing a dummy stripe region on both sides of the stripe region 63 of the above laser device, we can obtain the ninth embodiment of a semiconductor laser device according to the present invention.

EMBODIMENT 10

Next, explanation will be made of the third example of a semiconductor laser device of the single lobe type which example is used as the mother structure of the tenth embodiment of a semiconductor laser device according to the present invention, with reference to FIGS. 20A to 20C.

Figure 20A:
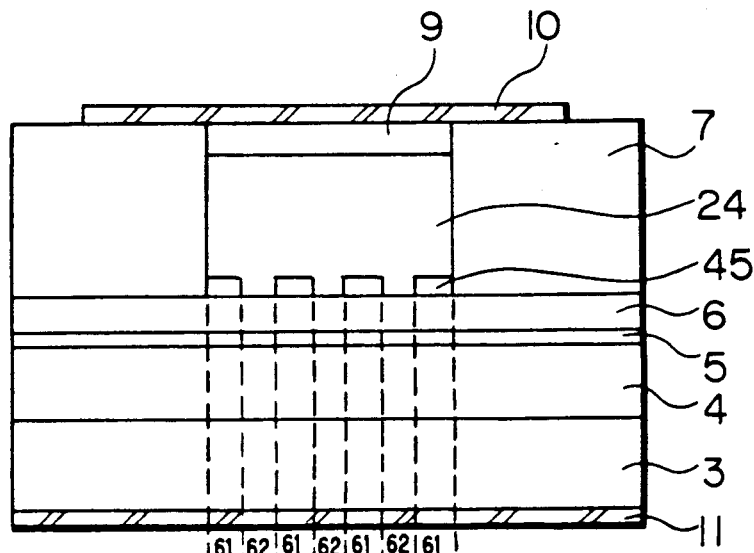
FIG. 20A is a sectional view showing a semiconductor laser device which is used as the mother structure of the tenth embodiment of a semiconductor laser device according to the present invention.
Figure 20B:
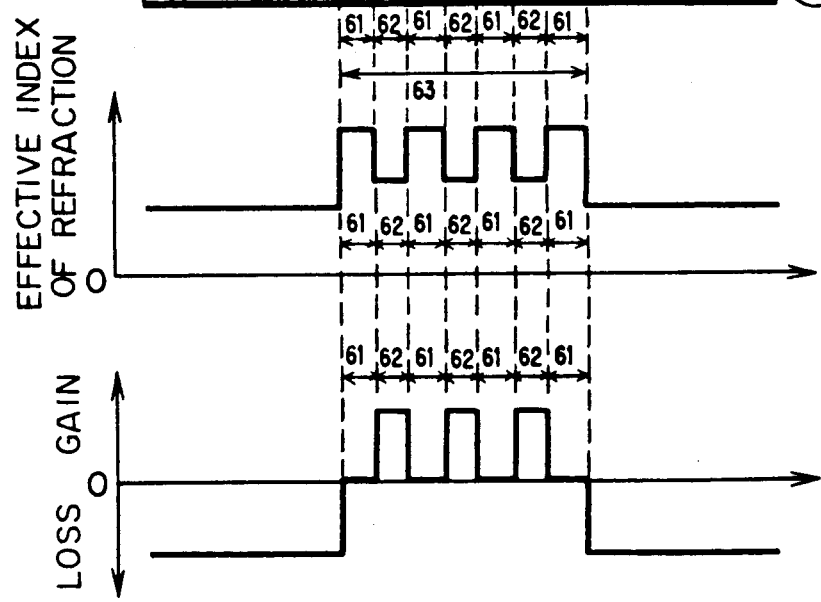
FIGS. 20B and 20C show the refractive index distribution and gain distribution in the semiconductor laser device of FIG. 20A, respectively.
Figure 20C:
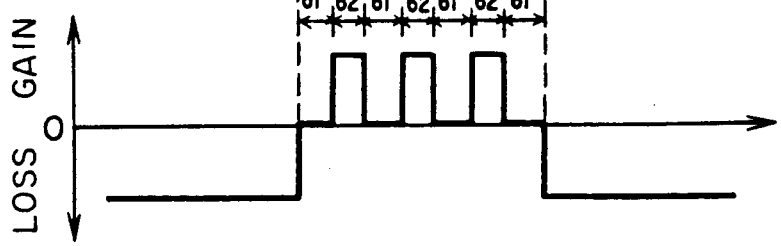

FIG. 20A is a section view showing the third example. Referring to FIG. 20A, an n-$Al_{0.37}Ga_{0.63}As$ cladding layer 4, and $Al_{0.06}Ga_{0.94}As$ active layer 5, n-$Al_{0.37}Ga_{0.63}As$ cladding layer 6 and an n-$Al_{0.37}Ga_{0.67}As$ layer 45 for narrowing a current path are successively piled on an n-GaAs substrate 3 by the MOCVD method, Then, 3 to 21 grooves each extended in the direction of cavity length and having a width of 0.5 to 5 $\mu$m for forming interstripe portions 62 are provided through photoetching techniques so that the current-path narrowing layer 45 is completely etched off and the surface of the p-$Al_{0.37}Ga_{0.63}As$ cladding layer 6 is exposed. At this time, a portion which is sandwiched between adjacent grooves and has a width of 1 to 2.9 $\mu$m, is left as a strip 61. Next, a p-$Al_{0.50}Ga_{0.50}As$ cladding layer 24 for filling up the grooves, and a p-GaAs cap layer 9 are formed by the MOCVD method. Then, a portion other than a stripe region 63 is etched through photoetching techniques so that the surface of the p-$Al_{0.37}Ga_{0.67}As$ cladding layer 6 is exposed. At this time, an SiO$_2$ film is used as an etching mask. Thereafter, the selective growth of an n-GaAs layer 7 for narrowing a current path is carried out while using the SiO$_2$ film as a mask. After the SiO$_2$ film has been removed, a positive electrode 10 and a negative electrode 11 are formed. The structure thus obtained is cleaved so as to form a laser device having a cavity length of about 300 $\mu$m. FIGS. 20B and 20C show the effective-index-of-refraction distribution and gain distribution in this laser device. A portion where the current-path narrowing layer 45 is left unetched, has a large effective index of refraction, and forms a stripe 61. Since the current-path narrowing layer 45 is left in the stripe 61, no current flows in the stripe. Further, no current flows on the outside of the stripe region 63, since the current-path narrowing layer 7 is formed on the outside of the stripe region 63. Thus, a current flows only in the interstripe portions 62, and a gain is obtained only at the interstripe portions 62.

The above laser device was able to generate a continuous wave having a wavelength of 830 nm, at room temperature. The value of threshold current was 100 mA, 200 mA and 300 mA for the formation of three stripes, six stripes and ten stripes, respectively. Further, in the laser device, oscillation took place stably in the first-order mode, and a single lobed far field pattern was obtained.

By providing a dummy stripe region on both side edges of the stripe region 63 of the above laser device, we can obtain the tenth embodiment of a semiconductor laser device according to the present invention.

In the above-mentioned embodiments, a laser beam having a wavelength of 780 or 830 nm was emitted. In AlGaAs laser devices according to the present invention, however, the wavelength of the emitted laser beam is not limited to the above values, but a continuous wave having a wavelength of 680 to 890 nm can be generated at room temperature. In the embodiments, only one AlGaAs layer is used as an active layer. Alternatively, an active layer of the MQW (multi-quantum well) structure formed of an AlGaAs superlattice may be used. Further, in the embodiments, a three-layered waveguide is used as a fundamental element. However, a semiconductor layer device according to the present invention may have an LOC (large optical cavity) structure, in which an optical guide layer adjacent to an active layer is formed only on one side of the active layer, or a GRIN-SCH (graded-index-separate-confinement-heterostructure) structure, in which an optical guide layer adjacent to an active layer is formed on both sides of the active layer.

Further, semiconductor laser devices each made up of semiconductor layers opposite in conductive type to semiconductor layers included in one of the embodiments, can produce the same effect as obtained by the embodiments.

Although AlGaAs layers are used in each of the embodiments, AlGaP layers, AsAlInP layers, AsAlGaInP layers, or AiGaInAs layers may be used in place of the AlGaAs layers.

As has been explained in the foregoing, according to the present invention, a portion for transmitting a current which does not contribute to oscillation, is provided on both sides of a stripe region, to make uniform the temperature distribution in the stripe region. Thus, in a phased array semiconductor laser device according to the present invention, phase coupled oscillation is generated all over the stripe region, even when a CW operation is performed. That is, oscillation of a single transverse mode is obtained, and a laser beam is emitted which is excellent in coherency.

We claim:

1. A semiconductor laser device, comprising:
a semiconductor substrate;
a semiconductor structure, including an active layer, provided on the substrate;
a first electrode provided on a side of the substrate;
a second electrode formed on a side of the semiconductor structure not adjacent the substrate;
a resonant cavity;
an oscillating stripe region which includes a plurality of oscillation stripes substantially parallel to the direction of cavity length, with each individual stripe in said plurality of oscillation stripes also being substantially parallel to each of the other individual oscillation stripes, so that phase locked oscillation can be generated at adjacent oscillation stripes, the oscillation stripe region being provided at a central part of the device; and
dummy regions for flowing a current which does not contribute to laser oscillation, disposed in proximity to the oscillation strip region, outside of the oscillation stripe region, at both sides thereof.

2. A semiconductor laser device according to claim 1, wherein said dummy regions include dummy stripes arranged outside of the oscillation stripe region, at both sides of the oscillation stripe region, and a current can flow in each dummy stripe but the laser oscillation is not generated in the dummy strip.

3. A semiconductor laser device comprising:
a semiconductor substrate;
a semiconductor structure, including an active layer, provided on the substrate;
a first electrode provided on a side of the substrate;
a second electrode formed on a side of the semiconductor structure not adjacent the substrate;
a resonant cavity;
an oscillation stripe region which includes a plurality of oscillation stripes and coupling regions, said plurality of oscillations tripes being substantially parallel to the direction of cavity length, and each individual stripe in said plurality of oscillation stripes also being substantially parallel to each of the other individual oscillation stripes, so that phase locked oscillation can be generated at adjacent oscillation stripes through said coupling regions, the oscillation stripe region being provided at a central part of the device; and
dummy regions for flowing a current which does not contribute to laser oscillation, disposed in proximity to the oscillation stripe regions, outside of the oscillation stripe region, at both sides thereof.

4. A semiconductor laser device according to claim 3, wherein said dummy regions include dummy stripes arranged outside of the oscillation strip region, at both sides of the oscillation stripe region, and a current can flow in each dummy stripe but the laser oscillation is not generated in the dummy stripe.

5. A semiconductor laser device according to claim 2, wherein each of the dummy stripes is extended to the facets of the semiconductor laser device, and the reflectivity of that area of one of the facets which corresponds to the dummy stripes, is made lower than the reflectivity of that area of the facet which corresponds to the oscillation stripe region.

6. A semiconductor laser device according to claim 4, wherein each of the dummy stripes is extended to the facets of the semiconductor laser device, and the reflectivity of that area of one of the facets which corresponds to the dummy stripes, is made lower than the reflectivity of that area of the facet which corresponds to the oscillation stripe region.

7. A semiconductor laser device according to claim 2, wherein a light absorption portion is present in each dummy stripe and each of the facets of the semiconductor laser device.

8. A semiconductor laser device according to claim 4, wherein a light absorption portion is present in each dummy stripe and each of the facets of the semiconductor laser device.

9. A semiconductor laser device according to claim 2, wherein each of the dummy stripes is divided into a plurality of parts in the direction of cavity length, and the parts are spaced apart from each other.

10. A semiconductor laser device according to claim 4, wherein each of the dummy stripes is divided into a plurality of parts in the direction of cavity length, and the parts are spaced apart from each other.

11. A semiconductor laser device according to claim 1, further comprising third electrodes for supplying a current to the dummy regions, wherein the current supplied to the dummy regions is controlled independently of a current supplied to the oscillation stripe region.

12. A semiconductor laser device according to claim 2, further comprising third electrodes for supplying a current to the dummy regions, wherein the current supplied to the dummy regions is controlled independently of a current supplied to the oscillation stripe region.

13. A semiconductor laser device according to claim 3, further comprising third electrodes for supplying a current to the dummy regions, wherein the current supplied to the dummy regions is controlled independently of a current supplied to the oscillation stripe region.

14. A semiconductor laser device according to claim 4, further comprising third electrodes for supplying a current to the dummy regions, wherein the current supplied to the dummy regions is controlled independently of a current supplied to the oscillation stripe region.

15. A semiconductor laser device according to claim 5, further comprising third electrodes for supplying a current to the dummy regions, wherein the current supplied to the dummy regions is controlled independently of a current supplied to the oscillation stripe region.

16. A semiconductor laser device according to claim 5, further comprising third electrodes for supplying a current to the dummy regions, wherein the current supplied to the dummy regions is controlled independently of a current supplied to the oscillation stripe region.

17. A semiconductor laser device according to claim 7, further comprising third electrodes from supplying a current to the dummy regions, wherein the current supplied to the dummy regions is controlled independently of a current supplied to the oscillation stripe region.

18. A semiconductor laser device according to claim 8, further comprising third electrodes for supplying a current to the dummy regions, wherein the current supplied to the dummy regions is controlled independently of a current supplied to the oscillation stripe region.

19. A semiconductor laser device according to claim 9, further comprising third electrodes for supplying a current to the dummy regions, wherein the current supplied to the dummy regions is controlled independently of a current supplied to the oscillation stripe region.

20. A semiconductor laser device according to claim 10, further comprising third electrodes for supplying a current to the dummy regions, wherein the current supplied to the dummy regions is controlled independently of a current supplied to the oscillation stripe region.

21. A semiconductor laser device according to claim 1, wherein in a case where the oscillation stripe region includes N oscillation stripes, the modes of the (N+1)th order and a higher order than the (N+1)th order are cut off by reducing the width of each oscillation stripe and the mode of the N-th order is cut off by preventing a current from flowing into each oscillation stripe, the current being prevented from flowing into each of the oscillation stripes by providing a current-injection blocking layer disposed for each of the oscillation stripes.

22. A semiconductor laser device according to claim 2, wherein in a case where the oscillation stripe region includes N oscillation stripes, the modes of the (N+1)th order and a higher order than the (N+1)th order are cut off by reducing the width of each oscillation stripe and the mode of the N-th order is cut off by preventing a current from flowing into each oscillation stripe, the current being prevented from flowing into each of the oscillation stripes by providing a current-injection blocking layer disposed for each of the oscillation stripes.

23. A semiconductor laser device according to claim 3, wherein in a case where the oscillation stripe region includes N oscillation stripes, the modes of the (N+1)th order and a higher order than the (N+1)th order are cut off by reducing the width of each oscillation stripe and the mode of the N-th order is cut off by preventing a current from flowing into each oscillation stripe, the current being prevented from flowing into each of the oscillation stripes by providing a current-injection blocking layer disposed for each of the oscillation stripes.

24. A semiconductor laser device according to claim 4, wherein in a case where the oscillation stripe region includes N oscillation stripes, the modes of the (N+1)th order and a higher order than the N+1)th order are cut off by reducing the width of each oscillation stripe and the mode of the N-th order is cut off by preventing a current from flowing into each oscillation stripe, the current being prevented from flowing into each of the oscillation stripes by providing a current-injection blocking layer disposed for each of the oscillation stripes.

25. A semiconductor laser device according to claim 1, wherein the width of each oscillation stripe is less than 3 $\mu$m.

26. A semiconductor laser device according to claim 2, wherein the width of each oscillation stripe is less than 3 $\mu$m.

27. A semiconductor laser device according to claim 3, wherein the width of each oscillation stripe is less than 3 $\mu$m.

28. A semiconductor laser device according to claim 4, wherein the width of each oscillation stripe is less than 3 $\mu$m.

29. A semiconductor laser device according to claim 2, wherein a width of each of the dummy stripes is 4–6 $\mu$m, and a dummy stripe is provided 4–6 $\mu$m outside a respective side of the oscillation stripe region.

30. A semiconductor laser device according to claim 4, wherein a width of each of the dummy stripes is 4–6 $\mu$m, and a dummy stripe is provided 4–6 $\mu$m outside a respective side of the oscillation stripe region.

31. A semiconductor laser device according to claim 11, wherein the third electrodes are separated from the second electrode.

* * * * *